United States Patent [19]

Wood

[11] Patent Number: 4,743,568

[45] Date of Patent: May 10, 1988

[54] MULTILEVEL INTERCONNECT TRANSFER PROCESS

[75] Inventor: Thomas E. Wood, Chandler, Ariz.

[73] Assignee: Motorola Inc., Schaumburg, Ill.

[21] Appl. No.: 77,476

[22] Filed: Jul. 24, 1987

[51] Int. Cl.$^4$ ............... H01L 21/283; H01L 21/316
[52] U.S. Cl. ............................. 437/189; 437/195;
437/183; 148/DIG. 135; 357/80; 439/67; 361/398
[58] Field of Search ........... 148/DIG. 135, DIG. 164;
357/67, 68, 71, 80, 81; 439/66, 67, 71; 437/180,
182, 183, 189, 190, 194, 195; 29/825, 874, 878;
174/68.5, 52 FP; 361/398

[56] References Cited

U.S. PATENT DOCUMENTS

| | | | |
|---|---|---|---|
| 4,251,852 | 2/1981 | Ecker et al. | 361/386 |
| 4,377,316 | 3/1983 | Ecker et al. | 439/71 |
| 4,420,203 | 12/1983 | Dry et al. | 439/67 |
| 4,446,477 | 5/1984 | Currie et al. | 357/74 |
| 4,480,288 | 10/1984 | Gazdik et al. | 361/398 |
| 4,630,096 | 12/1986 | Drye et al. | 357/81 |
| 4,698,662 | 10/1987 | Young et al. | 357/80 |

*Primary Examiner*—Brian E. Hearn
*Assistant Examiner*—T. N. Quach
*Attorney, Agent, or Firm*—Harry A. Wolin

[57] ABSTRACT

A method for processing multilevel interconnect lines separately from the multichip module on which they are to be employed. An oxide layer (16) is grown on a silicon wafer (14) and followed by a polyimide layer (18). Then a metal layer (20) is deposited and patterned. This is followed by another polyimide layer (24) having vias and another patterned metal layer (28). The vias allow for connections to be made between metal layers. Many polyimides and metal layers may be processed to allow for the desired number of levels of interconnect lines. After a last polyimide layer (32) is deposited, the oxide layer is etched to separate the multilevel interconnect line transfer (34) from the silicon wafer. After the processing of the multilevel interconnect lines, the multilevel interconnect line transfer is adhered to the multichip module in a predetermined relationship and electrical connections are made between them. In an alternative embodiment, a boron nitride layer (46) is bonded on a surface of silicon wafer (14). Stabilizing ring (44) is bonded on a second surface of the silicon wafer. Exposed regions of the wafer are etched away. The processing of multilevel interconnect line transfer (34) occurs on boron nitride layer (46) in the same manner as previously described.

14 Claims, 3 Drawing Sheets

4,743,568

MULTILEVEL INTERCONNECT TRANSFER PROCESS

BACKGROUND OF THE INVENTION

This invention generally pertains to a multilevel interconnect transfer process. Generally, in manufacturing multichip modules and the like, it is desirable that the number of shorts and opens be reduced as far as possible. When the number of shorts and opens in interconnect lines are reduced, a much higher yield may be obtained. This invention is to be used in multichip modules and the like. A typical module of this type is set forth in U.S. Pat. No. 4,630.096, entitled "High Density IC Module Assembly", issued Dec. 16, 1986. It should be understood, however, that this invention may be used in accordance with other types of multichip modules. In the prior art, interconnect lines generally were processed direcly onto a multichip module. Due to a lack of planarity on the module surface and other mitigating circumstances, a large number of shorts and opens occurred thereby decreasing the obtainable yield. Additionally, the entire module was subjected to an extremely high number of processing steps at high temperatures. These and other processing steps are no longer necessary with the present invention and therefore there is less chance for breakage.

SUMMARY OF THE INVENTION

The present invention pertains to a multilevel interconnect transfer process for use in multichip modules and the like which allows for multilevel interconnect lines to be processed separately from the multichip module and be bonded to the multichip module after the completion of processing. The multilevel interconnect lines are processed on a bare silicon wafer. This wafer is planar and therefore enables the interconnect lines to be processed with a minimum of shorts and opens thereby allowing a higher yield to be obtained.

One embodiment of this invention includes an oxide layer being grown on the polished surface of a silicon wafer. On this oxide layer a polyimide layer is formed. This is followed by the deposition of a metal layer which is then patterned to distinguish the desired interconnect line configuration. Next, another polyimide layer which includes vias extending down to the proceeding metal layer is formed. This is followed by the deposition of another metal layer which is also patterned. These steps may be repeated a number of times to allow for the desired multilevel configuration. A final polyimide layer is formed after the last metal layer is deposited and patterned. The multilevel interconnect lines are then separated from the silicon wafer by etching away the oxidation layer. The multilevel interconnect lines are then aligned and adhered to the multichip module in predetermined manner. After this has been done, vias are etched from the multilevel interconnect lines to the plurality of die of the multichip module. These vias are then metallized and patterned allowing for connections to be made between the plurality of die of the multichip module and the multilevel interconnect lines.

It is an object of the present invention to provide a new and improved method for processing multilevel interconnect lines separately from a multichip module.

If is a further object of the present invention to provide a new and improved method for proecessing multilevel interconnect lines wherein the multilevel interconnect lines may be later transferred to a multichip module.

It is further object of the present invention to provide a new and improved method for processing multilevel interconnect lines which does not subject a multichip module to numerous high temperature processing steps.

It is a further object of the present invention to provide a new and improved method for processing multilevel interconnect lines which enables a multichip module to be fabricated using fewer processing steps thereby reducing the chance of breakage.

It is a further object of the present invention to provide a new and improved method for processing multilevel interconnect lines which decreases the number of opens and shorts which occur.

It is a further object of the present invention to provide a new and improved method for processing multilevel interconnect lines which will allow for a higher yield of multichip modules.

It is a further object of the present invention to provide a new and improved method for processing multilevel interconnect lines which allows the testing of these interconnects before assembly of the multichip module.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
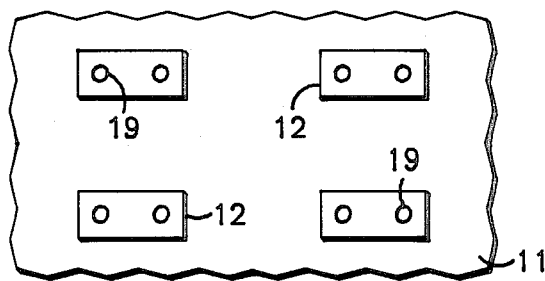
FIG. 1 is an enlarged top view of a multichip module prior to the processing of interconnect lines.
Figure 2:
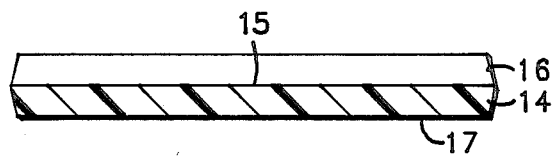
FIGS. 2–15 are enlarged cross-sectional views of a multichip module during various steps of processing.
Figure 3:
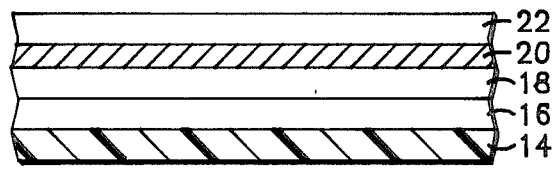

Referring specifically to FIG. 1, an enlarged top view of a section of a module, 10, is shown. Module 10 includes a substrate, 11, which is commonly a silicon wafer. Module 10 further includes a plurality of die, 12, which are incorporated in substrate 11 by any convenient method as for example by the method disclosed in copending application entitled "Coplanar Die to Substrate Bond Method" having Ser. No. 056597 and filed May 27, 1987. Further included on plurality of die 12 are a plurality of electrical contacts, 19.

Referring specifically to FIG. 2–15, enlarged cross sectional views of various parts of a multichip module during various stages of processing are shown. Initially, a bare silicon wafer, 14, is provided. Silicon wafer 14 includes a first polished surface, 15, and a second surface, 17. A thermal oxide layer, 16, is grown on first polished surface 15 of silicon wafer 14. It should be understood that oxide layer 16 serves as a separation layer which may be comprised of other materials. A first polyimide layer, 18, is then formed on oxide layer 16. Although polyimide layers are used in the embodiments disclosed herein, other polymers may be used in their place. Additionally, all patterned polyimide layers may be either photosensitive or non-photosensitive. Following the formation of first polyimide layer 18, a first metal layer, 20, is deposited. Additionally, other conductive materials may be used instead of metal. First metal layer 20 may be deposited by sputtering, evaporation, or other standard metal deposition techniques which are well known in the art. Commonly used metals are aluminum, copper, silver and gold. After the deposition of first metal layer 20, a first photoresist layer, 22, is patterned on said first metal layer. First metal layer 20 is then etched using first photoresist layer 22 as an etch mask. Once first metal layer 20 is etched, first photoresist layer 22 is removed. Although photoresist is used in this embodiment, other resist layers may be used.

Figure 4:
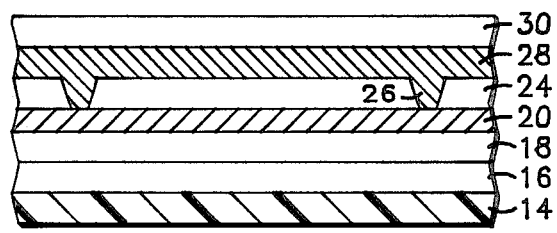
Figure 5:
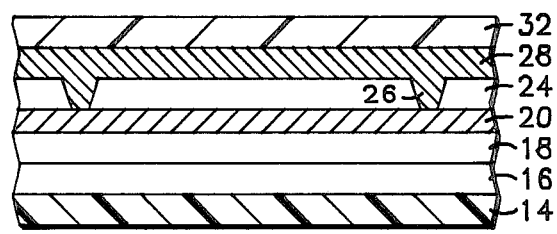
Figure 6:
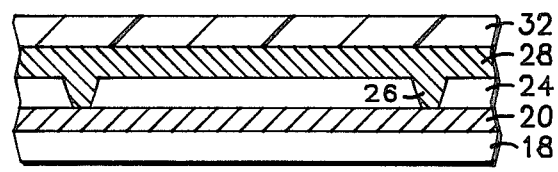
Figure 7:
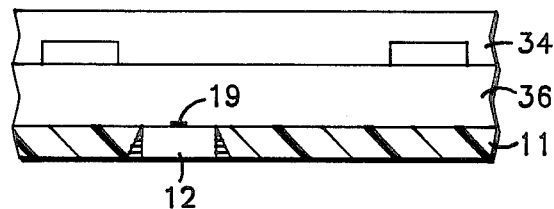
Figure 8:
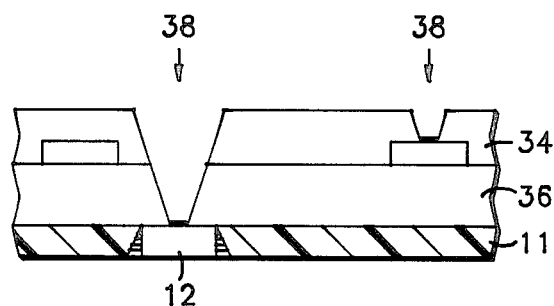
Figure 9:
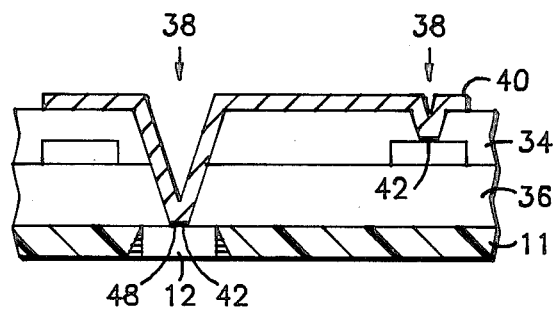

Following the removal of first photoresist layer 22, a second polyimide layer, 24, is formed (see FIG. 4). Second polyimide layer 24 includes vias, 26, which extend to the preceding metal layer 20. Vias 26 are etched in second polyimide layer 24 following its formation. If non-photosensitive polyimide is used, vias 26 may be formed using wet or dry etching methods. After vias 26 are etched, a second metal layer, 28, is deposited. Again, second metal layer 28 may be deposited in the same manner as first metal layer 20. Second metal layer 28 then has a second photoresist layer, 30, patterned upon it. Second metal layer 28 is then etched using second photoresist layer 30 as an etch mask. The deposition of second metal layer 28 causes vias 26 to be filled with metal thereby connecting first metal layer 20 and second metal layer 28. It should be understood that many different levels of interconnect lines may be processed by repeating the steps specified above. Once the final metal layer has been deposited and etched, a final polyimide layer, 32, (see FIG. 5) is formed over the final metal layer.

Once the processing of the multilevel interconnect lines has been completed, they are separated from silicon wafer 14. Once separated, the multilevel interconnect line transfer, 34, is formed. To separate transfer 34 from silicon wafer 14, oxide layer 16 is etched. In order for this etching to occur, it is important that no metal is along the edges of oxide layer 16 and silicon wafer 14. This would prevent the etchant from reaching oxide layer 16. Oxide layer 16 is etched from the outside in. In this embodiment, a special etchant is used. This etchant consists of 75 parts hydrochloric acid, 50 parts hydrofluoric acid, 125 parts of nitric acid, and 305 parts distilled water. It should be understood however, that other etchants may also be used.

Once transfer 34 has been separated from silicon wafer 14, it is aligned over module 10 in a predetermined relationship so that the various multilevel interconnect line of transfer 34 correspond to specific members of plurality of die 12. Once this alignment has take place, transfer 34 is adhered to module 10 by an adhesive layer 36 (see FIG. 7). In this embodiment, adhesive layer 36 is a polyimide adhesive, however, it should be understood that various other adhesives may be feasible in this process. Once transfer 34 is aligned and adhered to module 10, a nubmer of vias, 38, are etched (see FIG. 8). Vias 38 extend to the multilevel interconnect lines of transfer 34 and specific electrical contacts 19 of plurailty of die 12 of module 10. Once vias 38 have been etched, they are metallized and patterned with metal, 40, which allows connections, 42, (see FIG. 9) to be made between the multilevel interconnect lines of transfer 34 and memebers of plurality of die 12 of module 10.

Figure 10:
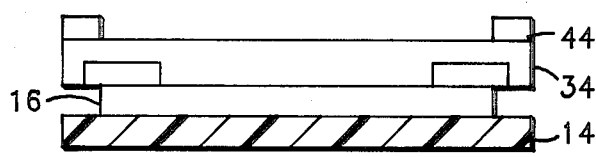
Figure 11:
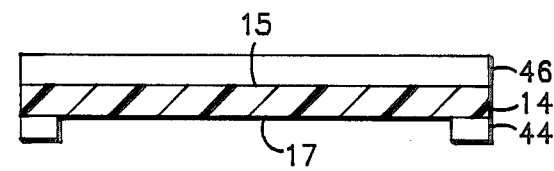
Figure 12:
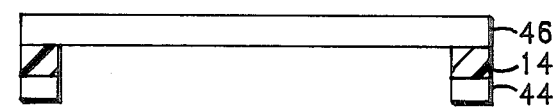
Figure 13:
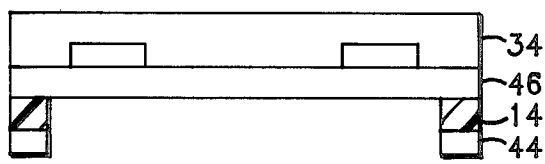
Figure 14:
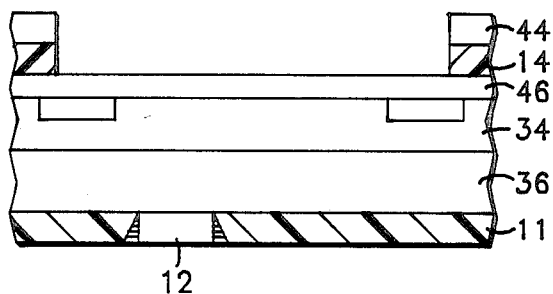
Figure 15:
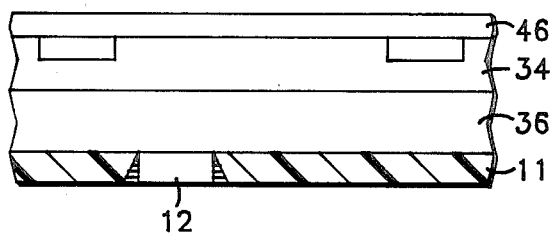

Another embodiment of the present invention differs slightly from the preceding embodiment in that oxide layer 16 is only partially etched to begin with during the separation of transfer 34 from silicon wafer 14 (See FIG. 10). In this embodiment, after the partial etching of oxide layer 16, a stabilizing ring, 44, is bonded to transfer 34. After the bonding of stabilizing ring 44, the remainder of oxide layer 16 is etched thereby allowing for the complete separation of transfer 34 from silicon wafer 14. Next, transfer 34 including stabilizing ring 44, is aligned and adhered to module 10 in the same manner as previously discussed. Following this alignment and adhesion, stabilizing ring 44 is removed and the process occurs as previously discussed. Stabilizing ring 44 may be made of many materials such as cardboard, metal, plastic, ceramic or pyrex. The purpose of stabilizing ring 44 is to prevent the shrinkage of transfer 34 once it is removed from silicon wafer 14 and prior to the adhesion to module 10. Additionally, stabilizer ring 44 enables transfer 34 to be handled easily.

Another embodiment of the present invention is shown in FIGS. 11 through 15. After providing silicon wafer 14, a boron nitride layer, 46, is deposited on polished first surface 15 of silicon wafer 14. Next, stabilizing ring 44 is bonded on second surface 17 of silicon wafer 14. Again, stabilizing ring 44 may be of a material such as cardboard, metal, plastic, ceramic or pyrex. Following the bonding of stabilizing ring 44 and the deposition of boron nitride layer 46, the exposed regions of silicon wafer 14 are etched away. X-ray mask techniques which are well known in the art are employed at this point in the process. After the etching occurs, the processing of multilevel interconnect line transfer 34 occurs on boron nitride layer 46 in the same manner as previously discussed. Transfer 34 is then aligned and adhered to module 10 using adhesive layer 36 as previously mentioned. Following this alignment and adhesion, stabilizing ring 44 and the remainder of silicon wafer 14 are removed from boron nitride layer 46. Following this removal, vias 38 are etched and metallized and patterned (See FIGS. 8 and 9) in the same manner as previously discussed.

Thus it is apparent that there has been provided, in accordance with the invention, an improved method for processing multilevel interconnect transfers to be employed in multichip modules which meets the objects and advantages set forth above. Thus, while specific embodiments of this invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

I claim:

1. A method of processing and transferring multilevel interconnect lines for use in a module having a plurality of electrical contacts incorporated therein comprising the steps of:

providing a substrate;

forming a separation layer on said substrate;

forming multilevel interconnect lines on said separation layer;

separating, at least partially, said substrate and said multilevel interconnect lines;

adhering said multilevel interconnect lines and a module having a plurality of electrical contacts in a predetermined relationship; and electrically connecting said multilevel interconnect lines and said plurality of electrical contacts of said module.

2. The method of claim 1 wherein the step of separating includes completely separating the substrate and the multilevel interconnect lines.

3. The method of claim 1 wherein the separation layer is comprised of a thermal oxide.

4. The method of claim 3 wherein the step of separating includes etching the separation layer.

5. The method of claim 3 further including the steps of:
adhering stabilizing means to the multilevel interconnect lines after said multilevel interconnect lines have been partially separated from the substrate;
etching the separation layer further to completely separate said multilevel interconnect lines from said substrate; and
removing said stabilizing means.

6. The method of claim 1 wherein the forming multilevel interconnect lines step further includes the steps of:
forming a first polymer layer on the separation layer of the substrate;
forming a first conductor layer on said first polymer layer;
patterning a first resist layer on said first conductor layer;
etching said first conductor layer using said first resist layer as an etch mask;
removing said first resist layer;
forming a second polymer layer, said second polymer layer having vias which extend to said first conductor layer;
forming a second conductor layer on said second polymer layer;
patterning a second resist layer on said second conductor layer;
etching said second conductor layer using said second resist layer as an etch mask;
removing said second resist layer; and
forming a last polymer layer.

7. The method of claim 6 wherein the steps of forming a second polymer layer, forming a second conductor layer, patterning a second resist layer, etching said second conductor layer and removing said second resist layer are performed more than once.

8. The method of claim 4 wherein the step of separating includes employing an etchant consisting essentially of HCl, HF, HNO$_3$ and distilled H$_2$O.

9. The method of claim 8 wherein the etchant consists essentially of 75 parts HCl, 50 parts HF, 125 parts HNO$_3$ and 305 parts distilled H$_2$O.

10. A method of processing and transferring multilevel interconnect lines for use in a module having a plurality of electrical contacts incorporated therein comprising the steps of:
providing a substrate having a first surface and a second surface;
forming a boron nitride layer on said first surface of said substrate;
bonding stabilizing means on said second surface of said substrate;
removing the portions of said substrate left exposed by said stabilizing means;
forming multilevel interconnect lines on said boron nitride layer;
adhering said multilevel interconnect lines including said boron nitride layer and said stabilizing means to a module having a plurality of electrical contacts, said multilevel interconnect lines and said module being in a predetermined relationship; and
electrically connecting said multilevel interconnect lines and said module.

11. The method of claim 10 further comprising the step of removing the stabilizing means.

12. The method of claim 11 wherein the step of forming multilevel interconnect lines is performed before the steps of bonding stabilizing means and removing the portions of said substrate.

13. The method of claim 10 wherein the step of forming multilevel interconnect lines further includes the steps of:
forming a first polymer layer on the boron nitride layer;
forming a first conductive layer on said first polymer layer;
patterning a first resist layer on said first conductive layer;
etching said first conductive layer using said first resist layer as an etch mask;
removing said first resist layer;
forming a second polymer layer, said second polymer layer having vias which extend to said first conductive layer;
forming a second conductive layer on said second polymer layer;
patterning a second resist layer on said second conductive layer;
etching said second conductive layer using said second resist layer as an etch mask;
removing said second resist layer; and
forming a last polymer layer.

14. The method of claim 13 wherein the steps of forming a second polymer layer, forming a second conductive layer, patterning a second resist layer, etching said second conductive layer and removing said second resist layer are performed more than once.

* * * * *